United States Patent
Luo et al.

(10) Patent No.: US 7,675,582 B2
(45) Date of Patent: Mar. 9, 2010

(54) STACKED STORAGE CAPACITOR STRUCTURE FOR A THIN FILM TRANSISTOR LIQUID CRYSTAL DISPLAY

(75) Inventors: Fang-Chen Luo, Hsinchu (TW); Chang-Cheng Lo, Chia Yi Hsien (TW)

(73) Assignee: AU Optronics Corporation, Hsinchu (TW)

(*) Notice: Subject to any disclaimer, the term of this patent is extended or adjusted under 35 U.S.C. 154(b) by 1290 days.

(21) Appl. No.: 11/004,389

(22) Filed: Dec. 3, 2004

(65) Prior Publication Data

US 2006/0119753 A1   Jun. 8, 2006

(51) Int. Cl.
G02F 1/1343 (2006.01)
G02F 1/13 (2006.01)
(52) U.S. Cl. .................... 349/39; 349/38; 349/192
(58) Field of Classification Search .......... 349/38, 349/39, 192
See application file for complete search history.

(56) References Cited

U.S. PATENT DOCUMENTS

| | | | | |
|---|---|---|---|---|
| 5,182,661 A * | 1/1993 | Ikeda et al. | ............. | 349/38 |
| 5,923,390 A * | 7/1999 | Jung Mok et al. | ......... | 349/38 |
| 6,191,830 B1 | 2/2001 | Gogna et al. | ............. | 349/38 |
| 6,777,709 B2 | 8/2004 | Wu et al. | ............... | 257/59 |
| 2002/0109813 A1* | 8/2002 | Yu et al. | ................ | 349/141 |
| 2002/0131010 A1* | 9/2002 | Ozaki et al. | ............. | 349/192 |

FOREIGN PATENT DOCUMENTS

| | | |
|---|---|---|
| JP | 3267921 | 11/1991 |
| JP | 4291240 | 10/1992 |
| JP | 7072506 | 3/1995 |
| JP | 09-162412 | 6/1997 |
| JP | 10-096962 | 4/1998 |
| JP | 11-044893 | 2/1999 |
| JP | 11-119260 | 4/1999 |
| JP | 2002189233 | 7/2002 |

* cited by examiner

*Primary Examiner*—David Nelms
*Assistant Examiner*—Lauren Nguyen
(74) *Attorney, Agent, or Firm*—Ware, Fressola, Van Der Sluys & Adolphson, LLP

(57) ABSTRACT

A stacked storage capacitor structure for use in each pixel of a TFT-LCD, wherein a first storage capacitor is formed by a first metal layer, a gate insulator layer and a second metal layer. The second capacitor is formed by the second metal layer, a passivation insulator layer and an ITO layer. The first metal layer and the ITO layer are joined together through a via hole which is etched in one insulator etching step during the overall fabrication process through both the gate insulator and the passivation insulator layers. As such, the two capacitors are connected in parallel in a stacked configuration. With the stacked storage capacitor structure, the charge storage capacity is increased without significantly affecting the aperture ratio of a pixel. The ITO and the pixel electrode can be different parts of an indium tine oxide layer deposited on the passivation insulator layer.

17 Claims, 5 Drawing Sheets

STACKED STORAGE CAPACITOR STRUCTURE FOR A THIN FILM TRANSISTOR LIQUID CRYSTAL DISPLAY

TECHNICAL FIELD

The present invention relates to a storage capacitor structure for use in a thin film transistor liquid crystal display particularly an amorphous silicon thin film transistor liquid crystal display.

BACKGROUND OF THE INVENTION

It is known in the art that thin film transistor liquid crystal displays (commonly referred to as TFT-LCD) seek to minimize the area needed for the storage capacitor used in such displays especially as the resolution of the display increases and therefore the pixel size decreases. The increase in display resolution is especially important for amorphous silicon TFT-LCD displays (a-Si TFT-LCDs). In particular, it is well known that as the display resolution increases, the area available on each pixel of such displays for the fabrication of the storage capacitor is diminished due to aperture ratio considerations. What this means is that for a given pixel it is desired that as the overall size of the pixel decreases, that the maximum amount of the pixel area be devoted to the pixel electrode rather than the storage capacitor associated with the pixel. As a result, as the resolution of a-Si TFT-LCD's has increased, the size of the storage capacitor is reduced to a point that the charge storage capacity significantly affects the performance of the overall LCD display in terms of artifacts such as flicker, image retention and cross-talk. It is therefore important that the storage capacitance and, particularly the area ratio of pixel electrode to the storage capacitance, be increased without adversely affecting the aperture ratio of the pixel.

In a conventional a-Si TFT-LCD fabrication process, the storage capacitor is either a metal-insulator-metal (MIM) structure or a metal-insulation-ITO (MII) structure. In the MIM structure, the first capacitor plate is the gate metal and the second capacitor plate is the source drain metal separated by the gate insulator layer. In the MII structure, the first capacitor plate is the gate metal and the second capacitor plate is the ITO (indium-tin oxide) electrode separated by both the gate insulator layer and the passivation insulator layer. However, when the resolution is increased, the area available for the storage capacitor is difficult to maintain without sacrificing the aperture ratio.

In order to increase charge storage capacity without sacrificing the aperture ratio of the pixel, or to maintain the charge storage capacity while increasing the aperture ratio of the pixel in an a-Si TFT-LCD display, it would be desirable to better utilize all layers of conductors and insulators for purposes of increasing the capacitance of the storage capacitor.

SUMMARY OF THE INVENTION

It is a primary objective of the present invention to increase the charge storage capacity without significantly affecting the aperture ratio in a pixel. The present invention is directed to better utilization of all layers of conductors and insulators for the fabrication of a storage capacitor in an associated pixel of an a-Si TFT-LCD array without changing the currently used fabrication processes for such a-Si TFT-LCD's. To accomplish this result, the source drain metal (M2) is used as a shared capacitor plate in a stacked capacitor structure comprising an MIM structure and a modified MII structure connected in parallel. In particular, the gate metal (M1) and the source-drain metal (M2) sandwich the gate insulator layer so as to form a first capacitor, and the second metal (M2) and the indium titanium oxide (ITO) electrode sandwich a passivation insulator layer so as to form a second capacitor. The two storage capacitors are stacked substantially on top of each other and are interconnected so as to be electrically in parallel with each other, thereby raising the overall capacitance of the storage capacitor while maintaining approximately the same area on the pixel as would be used in conventional storage capacitor fabrication.

More particularly, in an a-Si TFT-LCD display a stacked storage capacitor structure is described herein wherein a first storage capacitor is formed by the first metal layer acting as a first plate and the second metal layer acting as a second plate, with the gate insulator layer sandwiched in between acting as the insulator for the first storage capacitor. The second capacitor is formed by use of the second metal electrode (M2) acting as the second plate and the ITO electrode acting as the first plate of the second capacitor, with the passivation insulator layer acting as the insulator for the second storage capacitor. The second metal electrode (M2) is shared by both capacitors and the second capacitor is stacked on top of the first capacitor. The first metal electrode (M1) and the ITO electrode are joined together through a via hole and this via hole is etched in one insulator etching step during the overall fabrication process through both the gate insulator and the passivation insulator layers. The middle electrode for the stacked structure is therefore the second metal which is connected to the pixel electrode through via holes in the passivation insulator layer. The ITO electrode is connected to the first metal electrode (M1) through a via hole which is etched through the gate insulator and the passivation insulator. The pixel electrode is connected to the drain of the TFT through another via hole in the passivation insulator.

Thus, the first aspect of the present invention provides a stacked storage capacitor structure for a thin film transistor liquid crystal display having a plurality of pixels, each pixel having a pixel area, wherein at least some of the pixels have a storage capacitor formed substantially within the pixel area and associated with a stacked storage capacitor structure. The stacked storage capacitor structure comprises:

a first storage capacitor having a first plate formed by a first electrically conductive layer, a second plate formed by a second electrically conductive layer and a dielectric formed by a first insulator layer positioned between the first electrically conductive layer and the second electrically conductive layer; and a second storage capacitor having a first plate formed by a third electrically conductive layer, a second plate formed by the second electrically conductive layer and a dielectric formed by a second insulator layer positioned between the first and second plates, wherein the first electrically conductive layer and the third electrically conductive layer are electrically connected to each other so that the first and second storage capacitors are electrically connected in parallel, and wherein the second electrically conductive layer is positioned between the first electrically conductive layer and the third electrically conductive layer.

According to the present invention, each of said at least some of the pixels has a gate line disposed at one edge section of the pixel area for controlling electric charges in the storage capacitor, and the storage capacitor is formed substantially in said one edge section.

According to the present invention, each of said at least some of the pixels has a semiconductor switching element and a pixel electrode electrically connected to the switching element, and the pixel electrode is located within the pixel area adjacent to said one edge section in a non-overlapping manner.

According to the present invention, the switching element has a first switching end, a second switching end and a switching control terminal, the first switching end operatively connected to a signal line, the second end operatively connected to the pixel electrode, and each of said at least some of the pixels further comprises a further gate line operatively connected to the switching control terminal of the switch element for causing the opening and closing between the first and second switching ends.

According to the present invention, the second electrically conductive layer (M2) is operatively connected to the second switching end of the switching element via the pixel electrode and the first electrically conductive layer (M1) is operatively connected to the gate line.

According to the present invention, the first switching end is a source terminal, the second switching end is a drain terminal, and the switching control terminal is a gate terminal of a transistor, wherein the first electrically conductive layer is a gate metal layer, the first insulator layer is a gate insulator layer and second electrically conductive layer is a source-drain metal layer, and the third electrically conductive layer is made substantially of indium-tin oxide, and the second insulator layer is a passivation insulator layer.

According to the present invention, part of the passivation insulator layer is disposed adjacent to part of the gate insulator layer, and the pixel electrode is made substantially of indium-tin oxide, and at least part of the pixel electrode and part of the third electrically conductor layer are disposed on different sections of the passivation insulator layer.

Alternatively, each of said at least some of the pixels comprises a semiconductor switching element;

a gate line disposed at one edge section of the pixel area for controlling the switching element; and a common line disposed in a pixel section spaced from the gate line for controlling electric charges in the storage capacitor, and wherein the storage capacitor is formed substantially in said pixel section.

According to the present invention, each of said at least some of the pixels has a first pixel electrode segment and a second pixel electrode segment located within the pixel area and separated by said pixel section in a non-overlapping manner.

According to the present invention, the common line is substantially parallel to the gate line.

According to the present invention, the switching element has a first switching end, a second switching end and a switching control terminal, the first switching end operatively connected to a signal line, the second end operatively connected to the first pixel electrode segment, wherein each of said at least some of the pixels further comprises a gate line operatively connected to the switching control terminal of the switch element for causing the opening and closing between the first and second switching ends.

According to the present invention, the second electrically conductive layer (M2) is operatively connected to the second switching end of the switching element via the pixel electrode and the first electrically conductive layer (M1) is operatively connected to the common line.

According to the present invention, the first switching end is a source terminal, the second switching end is a drain terminal, and the switching control terminal is a gate terminal of a transistor, wherein the first electrically conductive layer is a gate metal layer, the first insulator layer is a gate insulator layer and second electrically conductive layer is a source-drain metal layer, and the third electrically conductive layer is made substantially of indium-tin oxide, and the second insulator layer is a passivation insulator layer.

According to the present invention, part of the passivation insulator layer is disposed adjacent to part of the gate insulator layer, and the first and second pixel electrode segment are made substantially of indium-tin oxide, wherein at least part of the first and second pixel electrode segments and part of the third electrically conductor layer are disposed on different sections of the passivation insulator layer.

The second aspect of the present invention provides a method of increasing charge storage capacity in a thin film transistor liquid crystal display having a plurality of pixels, each pixel having a pixel area and a pixel electrode located within the pixel area, wherein at least some of the pixels have a storage capacitor structure formed at a section of the pixel area substantially within the pixel area for storing electric charges associated with the pixel electrode, and wherein the section is adjacent to the pixel electrode in a non-overlapping manner. The method comprising the steps of:

forming a first storage capacitor having a first plate formed by a first electrically conductive layer, a second plate formed by a second electrically conductive layer and a dielectric formed by a first insulator layer positioned between the first electrically conductive layer and the second electrically conductive layer; and forming a second storage capacitor having a first plate formed by a third electrically conductive layer, a second plate formed by the second electrically conductive layer and a dielectric formed by a second insulator layer positioned between the first and second plates; and electrically connecting the first electrically conductive layer to the third electrically conductive layer so that the first and second storage capacitors are electrically connected in parallel for forming the storage capacitor structure, and wherein the second electrically conductive layer is positioned between the first electrically conductive layer and the third electrically conductive layer.

The third aspect of the present invention provides a thin film transistor liquid crystal display, comprising:

a plurality of pixels arranged in rows and columns, each pixel having a pixel area, a plurality of signal lines disposed between the pixel columns; and a plurality of gate lines disposed between the pixel rows, wherein at least some of the pixels have a storage capacitor formed substantially within the pixel area, the storage capacitor comprising:

a first storage capacitor having a first plate formed by a first electrically conductive layer, a second plate formed by a second electrically conductive layer and a dielectric formed by a first insulator layer positioned between the first electrically conductive layer and the second electrically conductive layer; and a second storage capacitor having a first plate formed by a third electrically conductive layer, a second plate formed by the second electrically conductive layer and a dielectric formed by a second insulator layer positioned between the first and second plates, wherein the first electrically conductive layer and the third electrically conductive layer are electrically connected to each other so that the first and second storage capacitors are electrically connected in parallel, and wherein the second electrically conductive layer is positioned between the first electrically conductive layer and the third electrically conductive layer.

According to the present invention, each of said at least some of the pixels has a further gate line disposed at one edge section of the pixel area for controlling electric charges in the storage capacitor, and the storage capacitor is formed substantially in said one edge section.

According to the present invention, each of said at least some of the pixels has a semiconductor switching element and a pixel electrode electrically connected to the switching element, and the pixel electrode is located within the pixel area adjacent to said one edge section in a non-overlapping manner.

According to the present invention, the switching element has a first switching end, a second switching end and a switching control terminal, the first switching end operatively connected to one of said plurality of signal lines, the second end operatively connected to the pixel electrode, and wherein the switching control terminal of the switch element is operatively connected to one of said plurality of gate lines for causing the opening and closing between the first and second switching ends.

Alternatively, each of said at least some of the pixels comprises
a semiconductor switching element operatively connected to the gate line; and
a common line disposed in a pixel section spaced from the gate line for controlling electric charges in the storage capacitor, and wherein the storage capacitor is formed substantially in said pixel section.

According to the present invention, each of said at least some of the pixels has a first pixel electrode segment and a second pixel electrode segment located within the pixel area and separated by said pixel section in a non-overlapping manner, and the common line is disposed between two adjacent gate lines.

According to the present invention, the switching element has a first switching end, a second switching end and a switching control terminal, wherein the first switching end is operatively connected to one of said plurality of signal lines, the second end is operatively connected to the first pixel electrode segment, and the switching control terminal of the switch element is operatively connected to one of the gate lines for causing the opening and closing between the first and second switching ends.

The present invention will become apparent upon reading the description taken in conjunction with FIGS. 1-8.

BRIEF DESCRIPTION OF THE DRAWINGS

For a better understanding of the nature of the present invention, reference is made to the following figures in which.

DETAILED DESCRIPTION OF THE INVENTION

Figure 1:
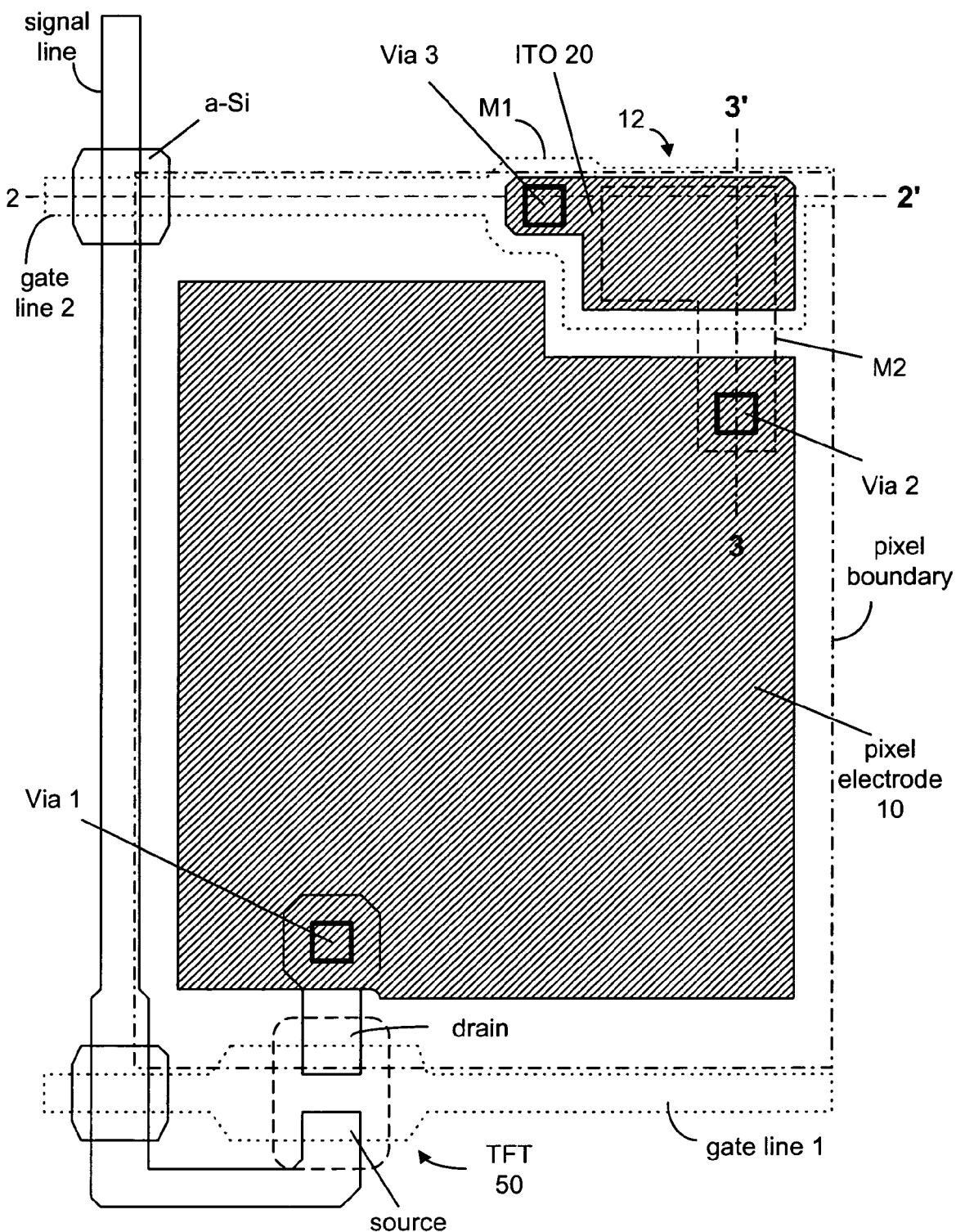
FIG. 1 is a plan view of a pixel where the storage capacitor is fabricated as a storage capacitor-on-gate (Cs-on-gate) design.
Figure 2:
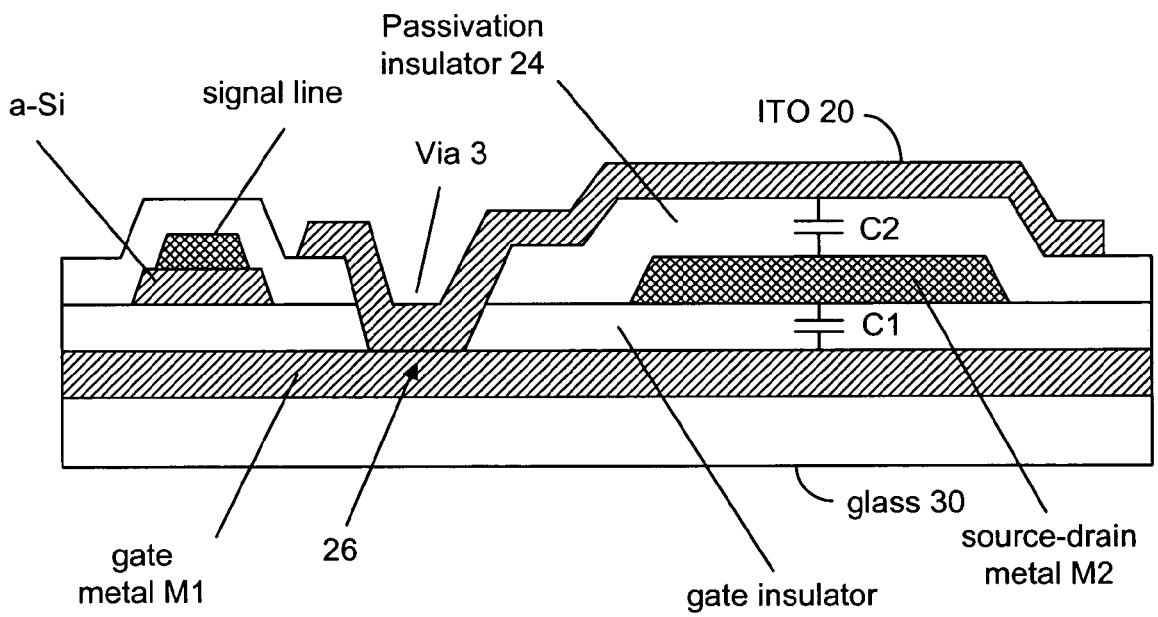
FIG. 2 is a cross-sectional view taken along line 2-2' of the pixel of FIG. 1.
Figure 3:
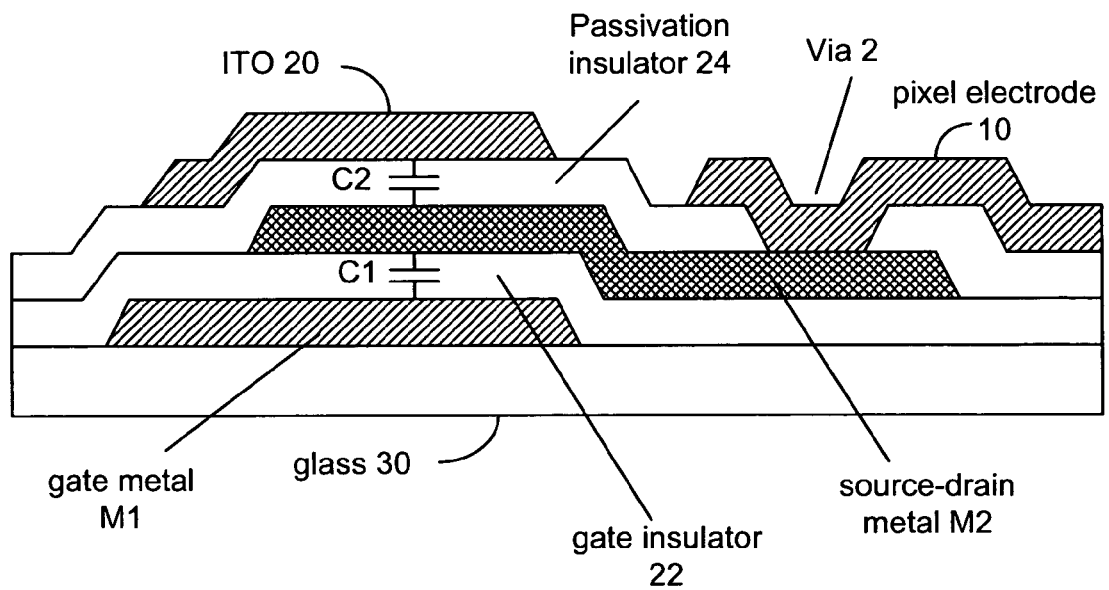
FIG. 3 is a cross-sectional view taken along line 3-3' of the pixel of FIG. 1.

As best seen in FIGS. 1, 2 and 3, a pixel according to the present invention which typically forms part of a pixel array comprises two general areas, one associated with the pixel electrode 10 and another associated with the control and storage capacitor area 12. The pixel fabrication technique shown in FIGS. 1, 2 and 3 is known in the art as a storage capacitor-on-gate design (Cs-on-gate). The fabrication technique in general is with regard to an amorphous silicon thin film transistor liquid crystal display (a-Si TFT-LCD) although the principles described could be used for other types of TFT-LCD displays, and as a p-Si TFT-LCD display.

As seen in FIGS. 1, 2 and 3, a storage capacitor for use in maintaining the state of the pixel electrode and thus of the LCD pixel between scans, comprises two storage capacitors shown diagrammatically as C1 and C2. The first capacitor C1 is formed between a first metal layer M1 (gate electrode) and a second metal layer M2. The second capacitor C2 is also shown diagrammatically in FIGS. 2 and 3 and is formed between the second metal layer M2 and an indium tin oxide (ITO) layer 20. For capacitor C1, metal layer M1 forms the first plate of the capacitor and metal layer M2 forms the second plate of the capacitor and the dielectric material therebetween is the gate insulator 22. For capacitor C2, the second plate is fabricated by the same metal layer M2 and the first plate is formed by the ITO layer 20. The dielectric between these two plates is the passivation insulator layer 24.

Capacitors C1 and C2 therefore share one plate, namely the metal layer M2, and the two capacitors are electrically connected in parallel to each other by the ITO layer 20 making contact with the metal layer M1 by means of Via 3 at region 26.

For fabricating such an a-Si TFT-LCD a five-mask process is typically used. Such a process is well known in the art. First, the gate metal M1 is deposited on a glass substrate 30. This gate metal is then patterned to the particular design needed for the pixels. A nitride layer is then deposited. Part of the nitride layer is the gate insulator layer 22. This is followed by the forming of an amorphous silicon (a-Si) and n+ doped amorphous silicon layer (n+ a-Si) by a plasma-enhanced chemical vapor deposition (PECVD) process. In addition, n+ a-Si and a-Si islands are formed on the nitride layer. Then a metal layer is deposited and patterned so as to form the source-drain electrode and the shared capacitor plate M2. After the etching of n+ a-Si to form the conducting channel for the thin film transistor (TFT) 50, a passivation insulator layer 24 is deposited. Via holes Via 1, Via 2 and Via 3 are then created by selective etching. Via 1 is used for the drain contact, and Via 2 is used for providing a contact point on the shared capacitor plate M2. Via 3 is for providing a contact point on the gate metal layer M1 (gate electrode). Via 1 and Vail 2 are created by etching the passivation insulator layer 24, while Via 3 is created by etching both the passivation insulator layer 24 and the gate insulator layer 22. An ITO layer is then deposited on top of the etched layers and patterned. After etching, part of the ITO layer forms the pixel electrode 10, which contacts the source-drain metal or the shared capacitor plate M2 through Via 2. The pixel electrode 10 is also connected to the drain contact through Via 1. As such, the shared capacitor plate M2 is electrically connected to the drain of the TFT 50 through the pixel electrode 10. The part of the ITO layer that forms the ITO layer 20 and serves as the top capacitor plate for storage capacitor C2 is connected to the gate electrode (gate metal) M1 through Via 3 (see FIG. 7). In this manner, a stacked storage capacitor structure comprising capacitors C1 and C2 is formed.

As can be seen in FIGS. 2 and 3, this stacked storage capacitor structure effectively uses the same general area 12 (see FIG. 1) that would otherwise be used for a storage capacitor comprising only a single pair of plates; but by the design of the present invention, the stacked storage capacitor effectively obtains a second pair of plates to form capacitor C2, thereby nearly doubling the total capacitance of the storage capacitor while maintaining approximately the same area that would otherwise be used to form a storage capacitor with only a single pair of plates. The equivalent circuit of the pixel structure of FIG. 1 is shown in FIG. 7.

Figure 4:
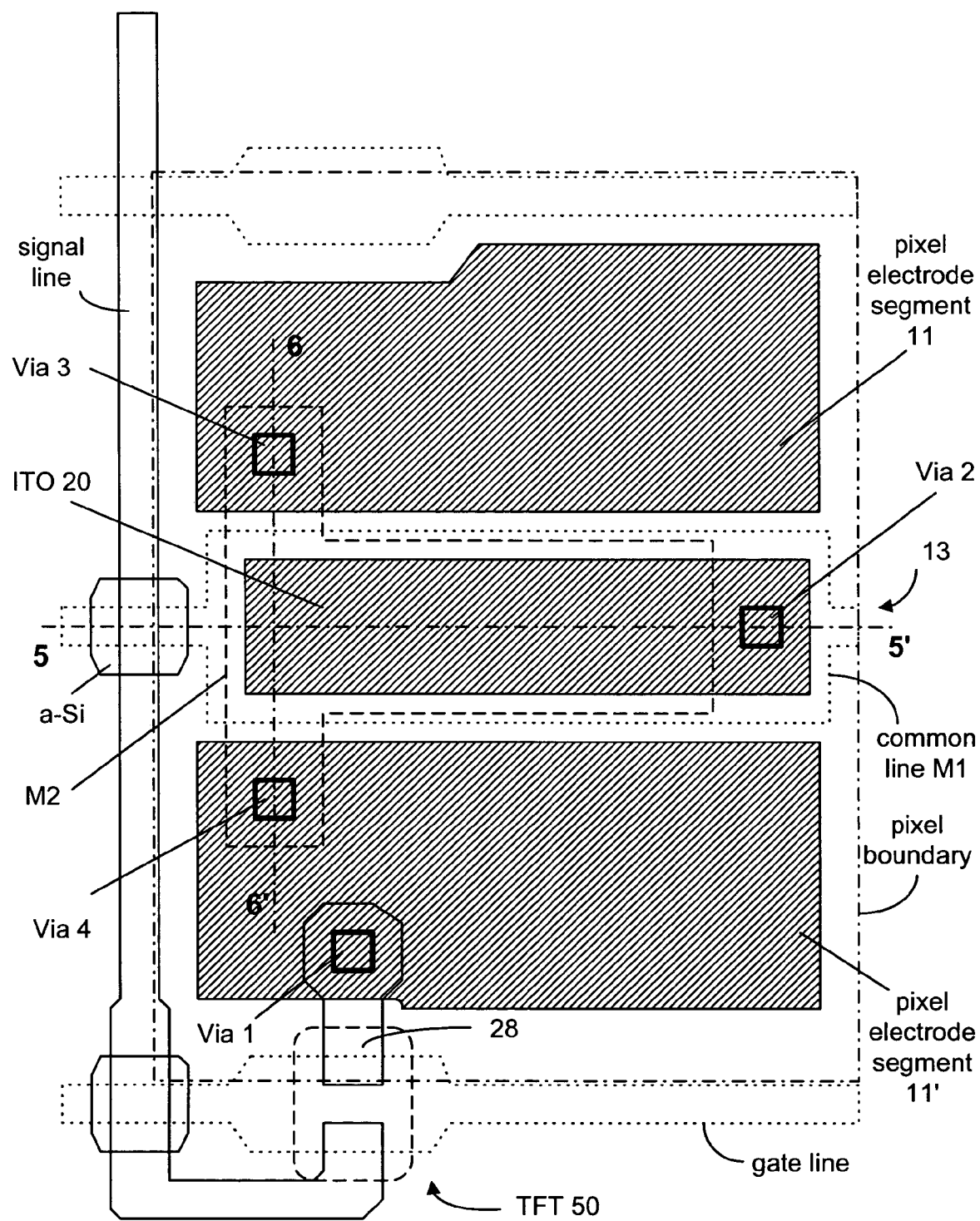
FIG. 4 is a plan view of a pixel where the storage capacitor is fabricated as a storage capacitor-on-common (Cs-on-com) design.
Figure 5:
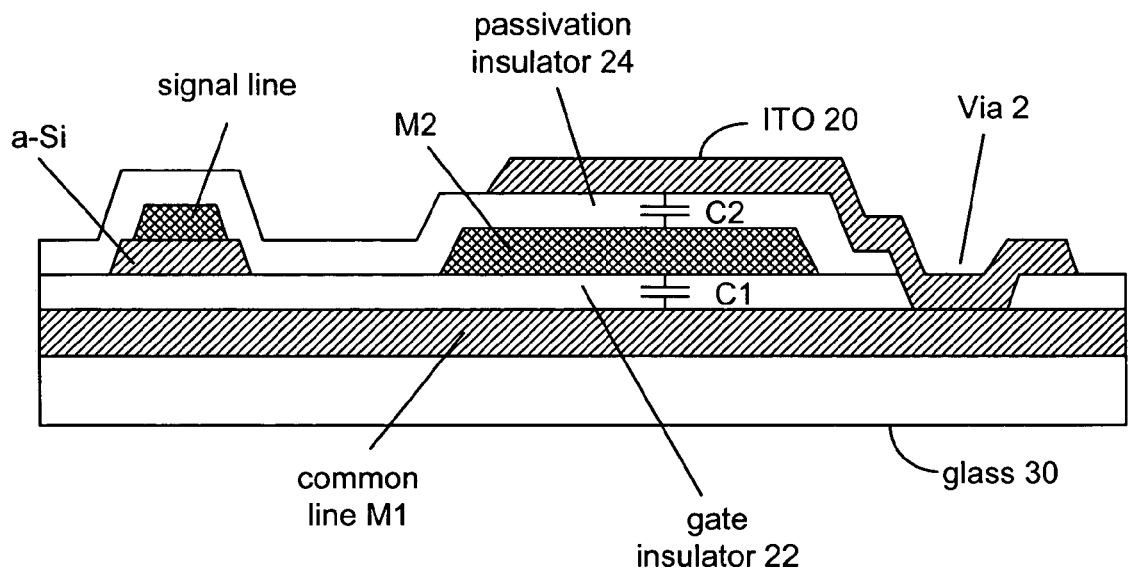
FIG. 5 is a cross-sectional view taken along line 5-5' of the pixel of FIG. 4.
Figure 6:
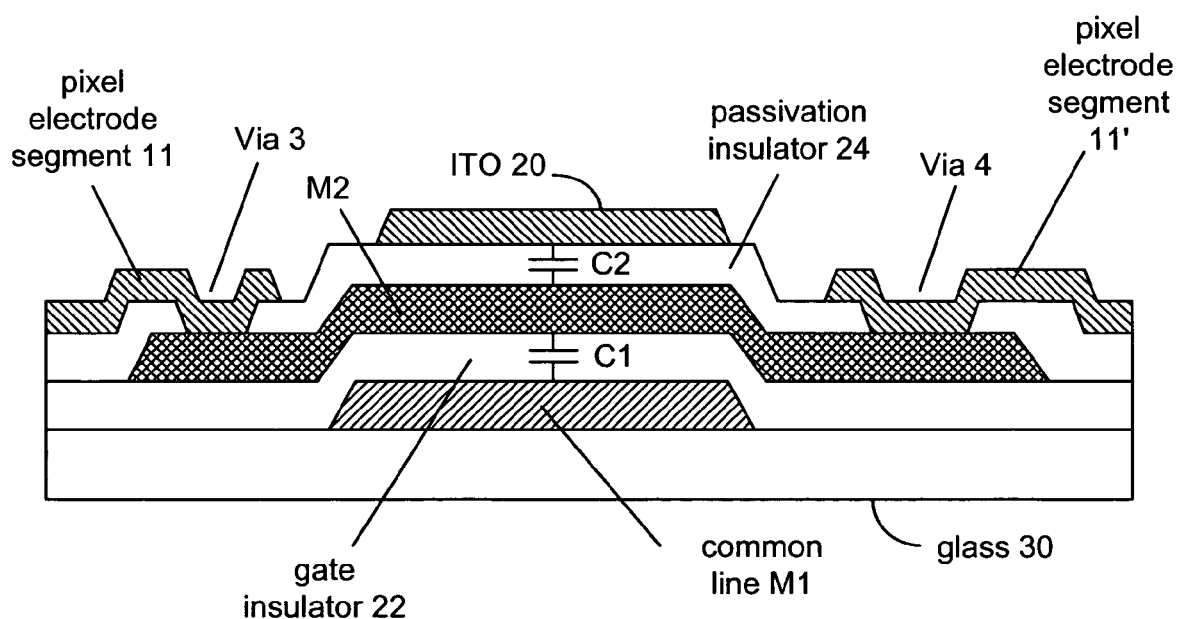
FIG. 6 is a cross-sectional view taken along line 6-6' of the pixel of FIG. 4.

FIGS. 4, 5 and 6 show another technique used to form an a-Si TFT-LCD display known as storage capacitor-on-common (Cs-on-com) design. As seen in FIG. 4, two pixel electrode segments 11 and 11' are separated by a region 13 having a common line M1. It is in this region that the stacked storage capacitor structure according to the present invention is formed.

Figure 8:
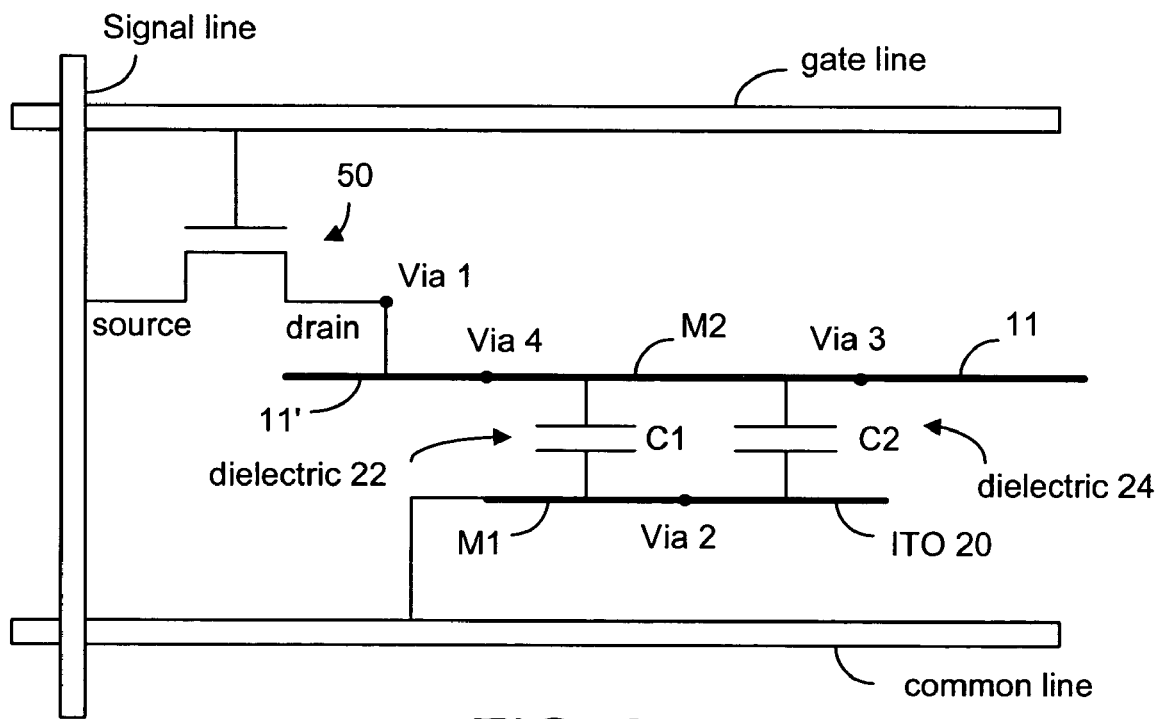
FIG. 8 shows an equivalent circuit of the pixel of FIG. 2.

FIGS. 5 and 6 show the cross-sectional views taken along lines 5-5' and 6-6' respectively. In this fabrication design, capacitor C1 has a first plate formed by the metal layer M1 (common line) and a second plate formed by the source-drain metal M2. The gate insulator layer 22 forms the dielectric for capacitor C1. The second capacitor C2 has a first plate formed by the ITO layer 20 and a second plate formed by the source-drain metal M2. The passivation insulator layer 24 is the dielectric for capacitor C2. Thus, C1 and C2 have a shared capacitor plate M2. The pixel electrode 11' is connected to the drain electrode 28 of the TFT 50 by Via 1 (see FIG. 4). The pixel electrode segment 11' is also connected to the shared capacitor plate M2 through Via 4. Similarly, the pixel electrode segment 11 is connected to the shared capacitor plate M2 through Via 3. The ITO layer 20 for capacitor C2 is connected to the common line M1 through Via 2 see FIG. 8). In this manner, a stacked storage capacitor structure is formed. The equivalent circuit for the pixel structure of FIG. 4 is shown in FIG. 8. As with the fabrication process as described in conjunction with FIGS. 2 and 3, a five-mask process can be used.

Figure 7:
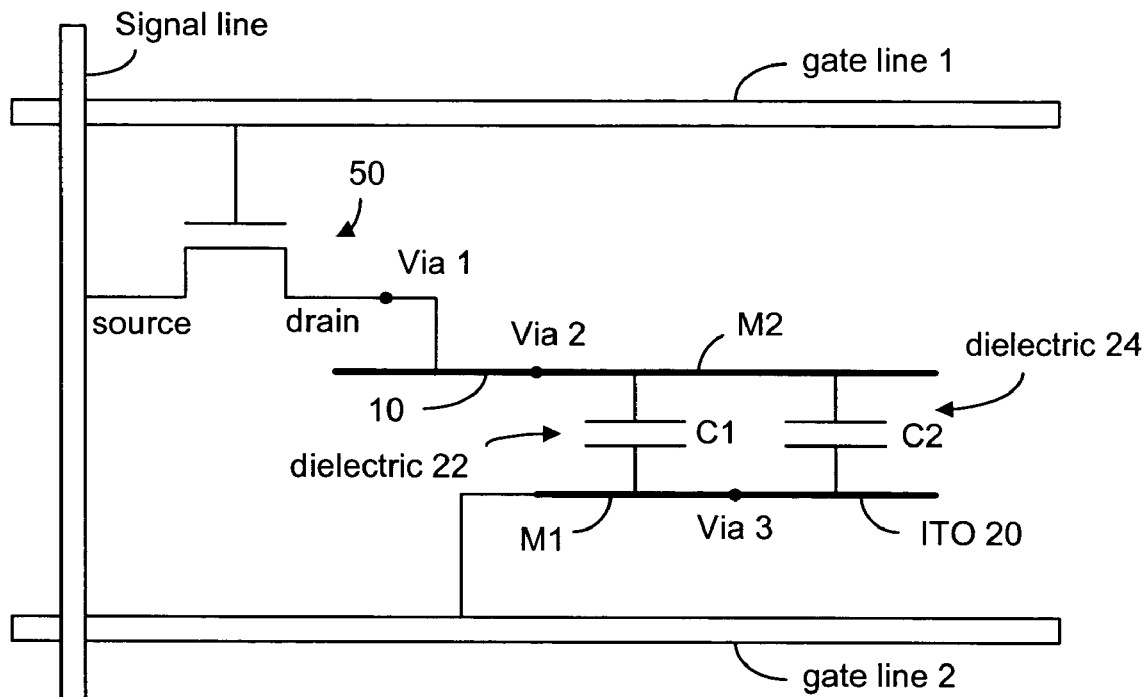
FIG. 7 shows an equivalent circuit of the pixel of FIG. 1.

As can be seen in the equivalent circuits shown in FIGS. 7 and 8, the source-drain metal layer M2 is a shared capacitor plate for the storage capacitors C1 and C2 and these two capacitors are connected at Via 3 in parallel so as to increase the charge storage capacity associated with the pixel electrode 10 (FIG. 7) or with the pixel electrode segments 11, 11' (FIG. 8). In both embodiments, M1 and ITO 20 are separately used for two capacitor plates of the stacked capacitor structure, and insulator layers 22 and 24 are separately used as the dielectric for C1 and the dielectric for C2. The difference between the two embodiments is where M1 is connected to. All the electrically conductive layers M1, M2, ITO 20 and the insulator layers 22, 24 are generally required in the five-mask fabricating process for most TFT-LCD displays. It is therefore apparent from the present description that a stacked storage capacitor structure, according to the present invention, can be fabricated for a-Si TFT-LCD display without additional material layers or masks. According to the present invention, the amount of pixel real estate associated with the storage capacitor is thereby minimized, which in turn maximizes the aperture ratio of the pixel, providing better performance as the resolution of the pixel increases.

It will be apparent to those skilled in the art that various modifications and variations can be made in the structure and method of the present invention without departing from the scope of the present invention. As a result, it is intended that the present invention covers such modifications and variations provided that they fall within the scope of the following claims and their equivalents.

What is claimed is:

1. A stacked storage capacitor structure for a thin film transistor liquid crystal display having a plurality of pixels, each pixel having a pixel area, wherein at least some of the pixels have a storage capacitor formed substantially within the pixel area and associated with the stacked storage capacitor structure, the stacked storage capacitor structure comprising:

a first storage capacitor having a first plate formed by a first electrically conductive layer, a second plate formed by a second electrically conductive layer and a dielectric formed by a first insulator layer positioned between the first electrically conductive layer and the second electrically conductive layer; and a second storage capacitor having a first plate formed by a third electrically conductive transparent layer, a second plate formed by the second electrically conductive layer and a dielectric formed by a second insulator layer positioned between the first and second plates, wherein the first electrically conductive layer and the third electrically conductive layer are electrically connected to each other through a single via so that the first and second storage capacitors are electrically connected in parallel, and wherein the second electrically conductive layer is positioned between the first electrically conductive layer and the third electrically conductive layer, wherein each of said at least some of the pixels further comprises:

a semiconductor switching element;

a gate line disposed at one edge section of the pixel area for controlling the switching element;

a common line disposed in a pixel section spaced from the gate line for controlling electric charges in the storage capacitor, and wherein the stacked storage capacitor structure is formed substantially in said pixel section; and a pixel electrode having a first pixel electrode segment and a second pixel electrode segment located within the pixel area separated by said pixel section in a non-overlapping manner, the first pixel electrode segment and the second pixel electrode segment electrically connected to the second electrically conductive layer, wherein the first electrically conducting layer is electrically connected to the common line.

2. A stacked storage capacitor structure as defined in claim 1, wherein the common line is substantially parallel to the gate line.

3. A stacked storage capacitor structure as defined in claim 1, wherein the switching element has a first switching end, a second switching end and a switching control terminal, the first switching end operatively connected to a signal line, the second end operatively connected to the first pixel electrode segment, and the switching control terminal is operatively connected to the gate line for causing electrical switching between the first and second switching ends and the second electrically conductive layer (M2) is operatively connected to the second switching end of the switching element via the pixel electrode.

4. A stacked storage capacitor structure as defined in claim 3, wherein the first switching end is a source terminal, the second switching end is a drain terminal, and the switching control terminal is a gate terminal of a transistor.

5. A stacked storage capacitor structure as defined in claim 4, wherein the third electrically conductive layer is made substantially of indium-tin oxide, and the second insulator layer is a passivation insulator layer.

6. A stacked storage capacitor structure as defined in claim 5, wherein part of the passivation insulator layer is disposed adjacent to part of the gate insulator layer, and the first and second pixel electrode segment are made substantially of indium-tin oxide, and wherein at least part of the first and second pixel electrode segments are disposed on different sections of the passivation insulator layer.

7. A liquid crystal display comprising:
a plurality of pixels arranged in rows and columns, each pixel having a pixel area,
a plurality of signal lines disposed between the pixel columns; and
a plurality of gate lines disposed between the pixel rows, wherein at least some of the pixels have a storage capacitor formed substantially within the pixel area, the storage capacitor comprising:
a first storage capacitor having a first plate formed by a first electrically conductive layer, a second plate formed by a second electrically conductive layer and a dielectric formed by a first insulator layer positioned between the first electrically conductive layer and the second electrically conductive layer; and
a second storage capacitor having a first plate formed by a third electrically conductive transparent layer, a second plate formed by the second electrically conductive layer and a dielectric formed by a second insulator layer positioned between the first and second plates, wherein the first electrically conductive layer and the third electrically conductive transparent layer are electrically connected to each other through a single via so that the first and second storage capacitors are electrically connected in parallel, and wherein the second electrically conductive layer is positioned between the first electrically conductive layer and the third electrically conductive transparent layer, wherein each of said at least some of the pixels comprises:
a semiconductor switching element operatively connected to the gate line;
a common line disposed in a pixel section spaced from the gate line for controlling electric charges in the storage capacitor, wherein the storage capacitor is formed substantially in said pixel section, and wherein the first electrically conductive layer is electrically connected to the common line;
a first pixel electrode segment and a second pixel electrode segment located within the pixel area and separated by the first plate of the second storage capacitor in a non-overlapping manner, the first pixel electrode segment and the second pixel electrode segment electrically connected to the second electrically conductive layer, wherein the switching element has a first switching end, a second switching end and a switching control terminal, wherein the first switching end is operatively connected to one of said plurality of signal lines, the second switching end is operatively connected to the first pixel electrode segment, and the switching control terminal is operatively connected to one of the gate lines for causing electrical switching between the first and second switching ends.

8. A liquid crystal display as defined in claim 7, wherein the common line is disposed between two adjacent gate lines.

9. A stacked storage capacitor structure as defined in claim 1, wherein each of the first pixel electrode segment and the second pixel electrode segment has an electrode width in a direction substantially parallel to the common line, and the first plate of the first storage capacitor comprises a single conductive segment having a segment length substantially equal to the electrode width.

10. A stacked storage capacitor structure as defined in claim 9, wherein the first plate of the second storage capacitor has a plate length in a direction substantially parallel to the common line and a plate width perpendicular to the plate length, wherein the single conductive segment having a substantially uniform width along the segment length, said uniform width substantially equal to plate width.

11. A stacked storage capacitor structure as defined in claims 9, wherein the pixel area comprises an area width substantially equal to the electrode width and the pixel area comprises a first side and an opposing second side along the area width, wherein the second electrically conductive layer is connected to the first pixel electrode segment and the second pixel electrode segment on the first side, and the via electrically connecting the first electrically conductive layer to the third electrically conductive layer is located on the second side.

12. A liquid crystal display as defined in claim 7, wherein each of the first pixel segment and the second pixel segment has an electrode width in a direction substantially parallel to the common line, and the first plate of the first storage capacitor comprises a single conductive segment having a length substantially equal to the electrode width.

13. A liquid crystal display as defined in claim 12, wherein the single conductive segment having a substantially uniform width along the length.

14. A liquid crystal display as defined in claim 12, wherein the pixel area comprises an area width substantially equal to the electrode width, and the pixel area comprises a first side and an opposing second side along the area width, wherein the second electrically conductive layer is electrically connected to the first pixel electrode segment and the second pixel electrode segment on the first side, and the via electrically connecting the first and the third electrically conductive layers is located on the second side.

15. A method for making a stacked storage capacitor structure in a liquid crystal display having a plurality of pixels, each pixel having a pixel electrode in a pixel area, wherein at least some of the pixels have a storage capacitor formed substantially within the pixel area in a pixel section and associated with the stacked storage capacitor structure, said method comprising:
providing a first patterned electrically conductive layer (M1) on a substrate, wherein the first patterned electrically conductive layer comprises a first capacitor plate in the pixel area arranged for connection to a common line;
providing a first dielectric layer over the first patterned electrically conductive layer and the substrate;
providing a second patterned electrically conductive layer (M2) over the first dielectric layer, the second patterned electrically conductive layer comprising a second capacitor plate in the pixel area;
providing a second dielectric layer over the second patterned electrically conductive layer and the first dielectric layer, wherein a first via is provided in the first and second dielectric layers for exposing part of the first patterned electrically conductive layer in the pixel area, and a second via and a third via are provided in the second dielectric layer for exposing part of the second patterned electrically conductive layer in the pixel area, providing a patterned transparent conductive layer over the second dielectric layer, wherein the patterned transparent conductive layer comprises:
  a third capacitor plate electrically connected to the first patterned electrically conductive layer through the first via,
  a first pixel electrode segment of the pixel electrode electrically connected to the second patterned electrically conductive layer through the second via, and
  a second pixel electrode segment of the pixel electrode electrically connected to the second patterned electrically conductive layer through the third via, the first pixel electrode segment and the second electrode segment separated by said third capacitor plate in a non-overlapping manner.

16. A method according to claim 15, wherein each pixel comprises:
  a semiconductor switching element; and
  a gate line disposed at one edge section of the pixel area for controlling the switching element, and wherein the common line is disposed in a pixel section spaced from the gate line for controlling electric charges in the storage capacitor, and wherein the storage capacitor is formed substantially in said pixel section.

17. A method according to claim 16, wherein the switching element has a first switching end, a second switching end and a switching control terminal, the first switching end operatively connected to a signal line, the second end operatively connected to the first pixel electrode segment, and the switching control terminal is operatively connected to a gate line operatively connected for causing electrical switching between the first and second switching ends.

* * * * *